US011662409B2

(12) United States Patent
Paul et al.

(10) Patent No.: US 11,662,409 B2
(45) Date of Patent: May 30, 2023

(54) PERFORMANCE-OPTIMIZED METHOD FOR DETERMINING VALID PARAMETER DATASETS

(71) Applicant: Siemens Healthcare GmbH, Erlangen (DE)

(72) Inventors: Dominik Paul, Bubenreuth (DE); Mario Zeller, Erlangen (DE); Flavio Carinci, Würzburg (DE)

(73) Assignee: Siemens Healthcare GmbH, Erlangen (DE)

(*) Notice: Subject to any disclaimer, the term of this patent is extended or adjusted under 35 U.S.C. 154(b) by 5 days.

(21) Appl. No.: 17/469,045

(22) Filed: Sep. 8, 2021

(65) Prior Publication Data

US 2022/0091209 A1 Mar. 24, 2022

(30) Foreign Application Priority Data

Sep. 18, 2020 (DE) ..................... 10 2020 211 727.6

(51) Int. Cl.
*G01R 33/54* (2006.01)
*G06F 16/23* (2019.01)
*G06F 17/12* (2006.01)

(52) U.S. Cl.
CPC ....... *G01R 33/543* (2013.01); *G06F 16/2365* (2019.01); *G06F 17/12* (2013.01)

(58) Field of Classification Search
None
See application file for complete search history.

(56) References Cited

U.S. PATENT DOCUMENTS 11,428,767 B2 * 8/2022 Gumbrecht .......... G01R 33/243
2013/0141092 A1 * 6/2013 Flammang ............ G01R 33/50 324/309

(Continued)

FOREIGN PATENT DOCUMENTS

DE 102012221465 B4 6/2014
DE 102015204483 A1 9/2016
DE 102016200549 A1 7/2017

OTHER PUBLICATIONS

German Office Action for German Application No. 2020 211 727.6 dated Jul. 7, 2021.

(Continued)

*Primary Examiner* — Rodney E Fuller
(74) *Attorney, Agent, or Firm* — Lempia Summerfield Katz LLC

(57) ABSTRACT

A method and an apparatus are provided for determining a valid parameter dataset for a protocol for an MRT examination by a MRT facility. The apparatus includes an input facility for importing a set of parameters to be used for performing the MRT examination; an interface for capturing at least one system value which represents an availability of a system resource for the MRT examination; a processor for calculating system resources required to perform the MRT examination using the imported parameters, and for executing a prepare function, which checks whether, with regard to the captured system values, the imported parameters are implementable in the MRT examination. If the parameters are not implementable, the processor is configured to calculate a modifying function for modifying the imported parameters based on the current system values and the required system resources and modify the imported parameters in accordance with the calculated modifying function.

23 Claims, 2 Drawing Sheets

START
Import a set of parameters S1
Calculate the system resources S2
Determine current system values S3
Execute a prepare function S4
Calculate a modifying function S5
Modify the imported parameters S6
END

(56) References Cited

U.S. PATENT DOCUMENTS

| | | | | |
|---|---|---|---|---|
| 2014/0161336 | A1 | 6/2014 | Biber et al. | |
| 2016/0266222 | A1 | 9/2016 | Nittka | |
| 2017/0205483 | A1 | 7/2017 | Feiweier | |
| 2017/0269181 | A1* | 9/2017 | Aley | G01R 33/5607 |
| 2022/0137172 | A1* | 5/2022 | Speckner | G01R 33/5611 324/309 |

OTHER PUBLICATIONS

German Office Action for German Application No. 2020 211 727.6 dated Jul. 7, 2021, with English translation.
Notice of Allowance for German Application No. 2020 211 727.6 dated Jul. 28, 2021, with English translation.

* cited by examiner

PERFORMANCE-OPTIMIZED METHOD FOR DETERMINING VALID PARAMETER DATASETS

The present patent document claims the benefit of German Patent Application No. 10 2020 211 727.6, filed Sep. 18, 2020, which is hereby incorporated by reference in its entirety.

TECHNICAL FIELD

The disclosure relates to a computer-implemented method, to an apparatus, and to a computer program product for determining a valid parameter dataset for a protocol in advance of an MRT examination by a magnetic resonance tomography facility.

BACKGROUND

In an examination by magnetic resonance tomography (tomography from the Greek for "section"), sectional images are produced, for instance of tissue inside a human body. This is based on combining magnetic field and radiofrequency (RF) pulse in order to excite the atomic nuclei of the body to be examined. Atoms align themselves in the magnetic field of a magnet. Electromagnetic radio-frequencies then cause them to oscillate. After switch-off, the atoms return to their initial position, releasing energy in the process. This energy (also called "nuclear resonance") is received by an RF coil, which is arranged on the body of a patient according to the region to be examined.

The RF coil may include a plurality of coil channels. A coil channel, also called a coil element, of a receive coil or RF coil may include a spatially demarcated receive unit of the RF coil. Using a plurality of coil channels may offer the advantage that a plurality of acquisition sequences may be performed simultaneously using different coil channels of the RF coil, whereby time may be saved in the capture of the magnetic resonance image data.

In addition, a gradient system provides data about the location at which the received signals are generated (spatial encoding). The raw data obtained overall is converted by a computer into two-dimensional or three-dimensional image data, which is used to display sectional images, for instance.

Before it is possible to perform an examination by magnetic resonance tomography (MRT), (also known as magnetic resonance imaging (MRI)), parameters for different sequence types are set, according to the purpose of the examination, by an operator at an input unit of a magnetic resonance tomography facility. There are two different basic forms: the gradient echo sequence and spin echo sequence. In addition, numerous variations of the sequences exist, for example depending on the body region to be examined, sequence progressions and parameters used.

Examples of parameters here are repetition time (TR), echo time (TE), flip angle, and bandwidth of the radiofrequency pulse. A plurality of MRT sequences may be needed in order to be able to carry out a full diagnosis. A specific combination of sequences for examining a specific tissue and/or part of the body and certain diseases may be called a protocol.

Parameters normally influence each other as a result of various dependencies and interactions. Setting parameters or a parameter dataset optimally may be time-consuming and requires a great deal of experience on the part of medical personnel.

Limited system resources of a specific magnetic resonance tomography facility may also complicate the setting of parameters. For example, it may not be known in advance, which settings require what level of system resources (e.g., memory space, which is sometimes needed for reconstructing the images).

Moreover, for safety reasons, it is not permitted during an MRT examination for parameters to exceed defined limit values (relating to the patient and/or relating to the components of the MR device for protecting against wear).

German Patent Application No. 102016200549 A1, for example, discloses technical support for setting an MRT sequence. In this case, permitted parameter value-ranges of preset parameters are determined by simulating a sequence run.

A continuous search and/or a binary search is used for the parameter search. The disadvantage here is that the method for finding a plurality of optimum parameters for a sequence is performed repeatedly, which is time-consuming. In addition, any prior knowledge of the examination to be carried out cannot be used in determining the parameters.

SUMMARY AND DESCRIPTION

The object of the present disclosure is therefore to provide a method, an apparatus, and a computer program product for improved determination of a valid parameter dataset for a protocol in advance of an MRT examination.

The scope of the present disclosure is defined solely by the appended claims and is not affected to any degree by the statements within this summary. The present embodiments may obviate one or more of the drawbacks or limitations in the related art.

In a first aspect, the disclosure relates to a computer-implemented method for determining a valid parameter dataset (e.g., a set of parameters) for a protocol in advance of an MRT examination by a magnetic resonance tomography facility. The method includes the following acts.

First, at least one parameter (one parameter or a set of parameters) intended to be used for performing the MRT examination is imported at an input facility of the magnetic resonance tomography facility. In this act, the user may also enter, for example, a specification of the number of coil channels required. The system resources required, and, e.g., also the number of coil channels required, to perform the MRT examination using the imported parameters may be calculated automatically by an algorithm. In addition, a set of current system values is captured which represents an availability of a system resource for the MRT examination, and in particular indicates the available memory space requirement for reconstructing an image and/or indicates a coil-channel count of the magnetic resonance tomography facility. A prepare function is then executed. The prepare function checks whether, as regards the captured current system values (e.g., under actually available current system conditions or using the current system status), the imported parameters are implementable or feasible in the MRT examination. If the parameters are not implementable or feasible in the MRT examination, the following acts are performed: a modifying function is calculated dynamically for modifying the parameters on the basis of the current system values and the required system resources; the parameters are modified in steps in accordance with the calculated modifying function, in particular reducing the number of coil channels in steps down to a pre-configurable limit; and the prepare function is executed repeatedly in order to determine the valid parameter dataset.

The aim of the method is to determine a valid parameter dataset containing, for instance, a (required) number of coil channels given a limited system resource (e.g. memory space), e.g., a number of coil channels required as a minimum to still be able to perform, for instance, an image reconstruction despite an insufficiently available system resource.

The term "valid" parameter dataset is intended to mean that the parameter dataset is configured to the resources currently present and is also configured such that the captured limit values (or specifications, captured system values) may be satisfied. For example, the limit values may be a limit value for the applied RF power (SAR), a limit value for the applied gradient switching activity (watchdog for the gradient switching activity), or a limit value for the gradient power, in particular in relation to the gradient axes, to avoid wear and tear to components of the magnetic resonance tomography facility (SeqBooster).

The system resources currently present may be based on the currently available main memory for reconstructing an image on the basis of acquired MRT raw data.

The imported parameters (also "set of the imported parameters") may include parameters that are also part of the parameter dataset and differ from the calculated valid parameter dataset in that the calculated valid parameter dataset is configured to the current status of the MRT system (e.g., available workstation memory, compliance with limit values). The imported set of parameters is thus only a planning specification. These parameters are meant to be used to perform the intended MRT examination. The search for a valid parameter dataset is therefore no longer made for all system statuses equally but specifically, and on the basis of, the captured circumstances. The search may hence be performed significantly faster. If the calculation shows, for example, that the specifications and/or defined limit values cannot be met or satisfied, then the modifying function may be used to change at least one parameter such that it may be implemented under the current system conditions (including the other parameters and the available system resources).

From the set of imported (planned) parameters, it may be determined by a function, which system resources are required for the implementation, in order then to check in a subsequent act, whether the currently available system resources are sufficient, for instance, the main memory for image reconstruction. If this is not the case, the parameters are selectively modified, for instance, the number of coil channels are reduced, until the currently available system resources are sufficient. This successive modifying of the parameters is now no longer performed equally for all system statuses, but instead the current system resources are taken into account directly by the modifying function. The valid parameter dataset is thus characterized both by a set of consistent parameters and by those parameters that may actually be implemented under the (e.g., captured current) system conditions (e.g., available memory space and/or limit-value specifications).

According to an embodiment, the method includes determining a coil-channel reduction factor r for applying in the stepwise reduction of the coil-channel count.

In a further embodiment, the method, and in particular the calculation of the modifying function and/or the stepwise modification, includes solving a linear or quadratic equation system, which characterizes a linear or quadratic relationship between a coil-channel number, R, of the captured system value, in particular a required memory space requirement, B, and an available memory space requirement, V.

The (current) system value may represent an available memory space requirement, in particular a main-memory space requirement for image reconstruction.

In an embodiment for the memory space requirement, the number of coil channels may be reduced by a coil reduction factor, which is recalculated for each step of the stepwise modification.

In the method, in which the number of coil channels is reduced by a coil reduction factor, this factor is determined on the basis of the required and the available amount of memory, and the required number of coil channels.

Once the number of coil channels has been reduced by a first coil reduction factor in a first act, the prepare function may be executed in order to determine the second memory space requirement, which is now needed, for the correspondingly reduced channel count, and in which, if the second memory space requirement is sufficient, a check is performed as to whether an increase in the number of coil channels is possible. If this is the case, the channel count is increased up to the pre-configured limit. If the second memory space requirement is not sufficient, a linear equation system is solved in order to determine the number of coil channels.

Once the number of coil channels has been reduced by a second coil reduction factor in a second act, the prepare function is re-executed in order to determine the third memory space requirement, which is now needed. If the third memory space requirement is sufficient, a check is then performed as to whether an increase in the number of coil channels is possible. If this is the case, the channel count is increased up to the pre-configured limit. If the third memory space requirement is not sufficient, a quadratic equation system is solved in order to determine the number of coil channels.

In one embodiment, a system value in the method may represent a reference value (or limit value) for monitoring an applied RF power or relating to specified limit values for the RF power. In a further embodiment of the method, the system value may represent a reference value or limit value for monitoring an applied gradient switching activity. It is thereby possible to avoid stimulating the muscles of the patient during the MRT examination.

In a further embodiment, the method may contain a system value which represents a reference value for monitoring an applied gradient switching activity in order to prevent damage to the components of the magnetic resonance tomography facility.

Achieving the object was described above with reference to the method. Features, advantages, or alternative embodiments mentioned in this connection may also be applied equally to the other claimed subject matter, and vice versa. In other words, the physical claims (which claims are aimed at an apparatus or at a computer program product, for example) may also be developed by combining with features described or claimed in connection with the method. The corresponding functional features of the method are embodied in this case by corresponding physical modules, in particular, by hardware modules or microprocessor modules, of the system or product, and vice versa.

In a further aspect, the disclosure relates to an apparatus for determining a valid parameter dataset for a protocol for an MRT examination by a magnetic resonance tomography facility. The apparatus includes an input facility for importing at an input facility of the magnetic resonance tomography facility, parameters intended to be used for performing the MRT examination, including a specification of a number of required coil channels, R. The apparatus further includes an interface for capturing at least one (e.g., current) system value which represents an availability of a system resource for the MRT examination, and in particular indicates the available memory space requirement for reconstructing an image and/or indicates a coil-channel count of the magnetic resonance tomography facility. The apparatus further includes a processor for calculating system resources required to perform the MRT examination using the imported parameters. The processor is also configured to execute a prepare function, which checks whether, with regard to the captured system values, the imported parameters are implementable in the MRT examination. If the parameters are not implementable, the processor is configured to: calculate a modifying function for modifying the parameters on the basis of the current system values and the required system resources; modify the parameters in steps in accordance with the calculated modifying function, in particular to reduce the number of coil channels in steps down to a pre-configurable limit; and execute repeatedly the prepare function in order to determine the valid parameter dataset.

The apparatus is used advantageously in a magnetic resonance tomography facility.

The input facility may be part of an input/output unit, which in some cases may be designed to be a user interface, for instance a graphical user interface (GUI), and/or to have a keyboard and a screen. The determined valid parameter dataset may be output on the input/output unit or transferred to a system controller of the magnetic resonance tomography facility.

The disclosure also provides a computer program product which includes code configured to perform the method when the computer program product is executed.

The object is also achieved by a computer program including computer program code for performing all the method acts of the above-detailed method when the computer program is executed on a computer. It is also possible that the computer program is stored on a medium that may be read by a computer.

BRIEF DESCRIPTION OF THE DRAWINGS

The disclosure is described in greater detail below with reference to the exemplary embodiments presented in the figures, in which.

DETAILED DESCRIPTION

Figure 1:
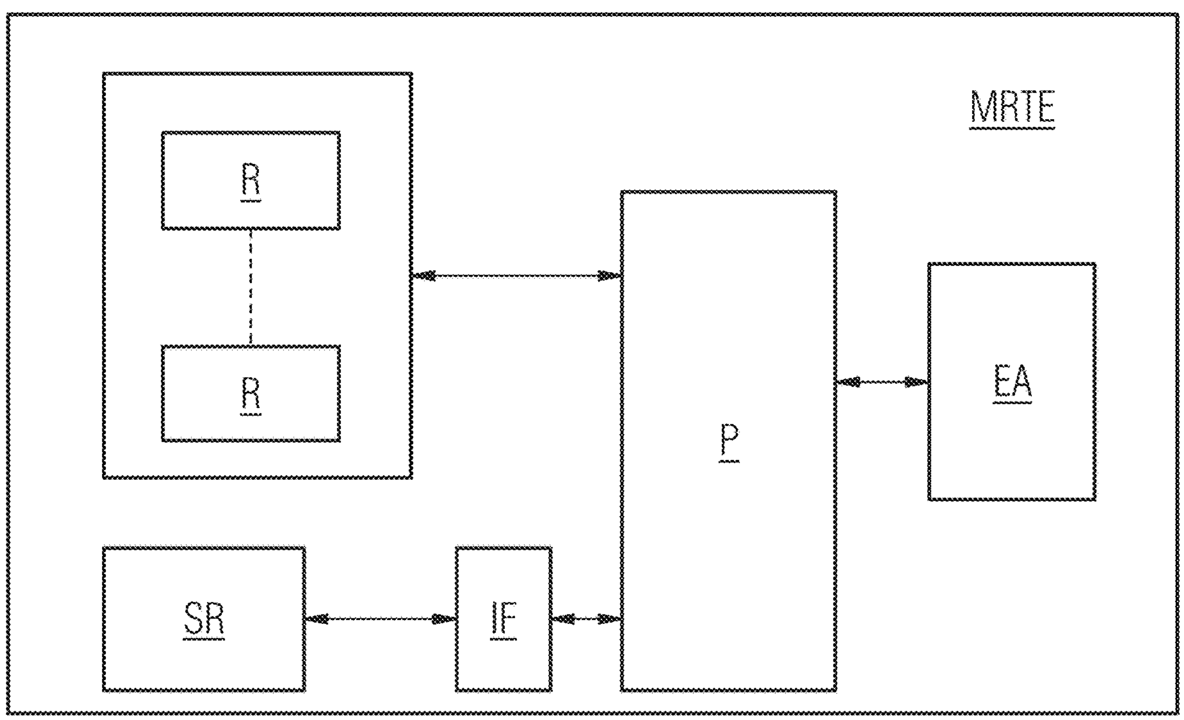
FIG. 1 is a block diagram of a system according to an embodiment.

FIG. 1 depicts schematically the design of a magnetic resonance tomography facility MRTE. Only those parts are shown and described that are necessary to the understanding of the disclosure.

The magnetic resonance tomography facility MRTE includes a processor P, an input/output unit EA, a system resource SR, coil channels R, and an interface IF for capturing at least one system value which represents an availability of a system resource SR for the MRT examination.

A processor P receives input data from the input/output unit EA. The input data may be protocols and/or even individual sequences containing the associated parameters which were selected by an operator, for instance a radiologist.

At the end of the method, the valid parameter dataset for a specific protocol is output at the input/output unit EA.

The processor P, which controls the magnetic resonance tomography facility MRTE, controls in particular the running of the sequences and the running of the method, which method is performed before the actual MRT examination. The processor also controls the creation of the image data from the raw data, and the display of the image data on the input/output device EA, and also the output of the valid parameter dataset for a protocol in advance of the MRT examination.

In addition to including a magnet (not shown here), the magnetic resonance tomography facility includes a plurality of coils, which supply raw data to the processor P via coil channels R according to the protocol. The coils receive the magnetic resonance signals from the body of the patient.

The magnetic resonance tomography facility MRTE additionally includes system resources SR, for example, a memory. The memory may be configured to reconstruct the image data from the raw data. The amount of memory available may be proportional to the coil-channel count (e.g., ~1 GB/channel) of the system.

The processor receives, via an interface IF for capturing a system value, data about the availability of system resources for an MRT examination. For instance, the processor may be notified of the available memory space for an image reconstruction. The available memory space may vary depending on the type of the magnetic resonance tomography facility MRTE. For example, a magnetic resonance tomography facility of type Lumina, which has 16 coil channels, has correspondingly less memory space than one of type Vida, which has 64 or 128 coil channels. The situation may therefore arise in which the memory space may not be sufficient for carrying out certain protocols that are based on memory-intensive reconstruction techniques (e.g., compressed sensing).

Therefore, the aim of the method is to facilitate a faster search for valid parameter datasets. This is made possible because the search may take into account prior knowledge or contextual knowledge of the MRT system, in particular, in the form of system values and/or the sequence to be carried out. This advantageously shortens the waiting time for patient and operator.

Figure 2:
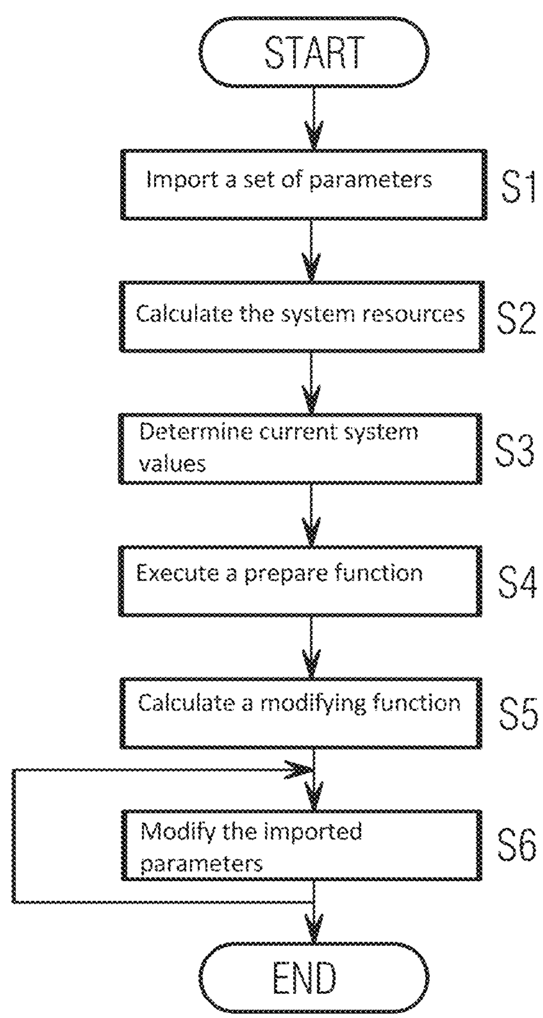
FIG. 2 is a flow diagram for illustrating the method according to an embodiment.

FIG. 2 depicts the acts of the method using the example of determining the required number of coil elements for a protocol when the available memory space is less than the required memory space.

The method is performed before the actual MRT examination in order to obtain a valid parameter dataset for a protocol.

A "valid" parameter dataset means here that the parameter dataset is configured to existing system resources, and captured limit values are satisfied.

At the start, in act S1, a set of parameters is imported at the input/output facility corresponding to the protocol of the MRT examination. Likewise, the number of required coil channels R is imported.

In act S2, the system resources required to perform the MRT examination using the imported parameters are calculated.

Then, in act S3, current system values are determined which represent an availability of a system resource for the relevant MRT examination. In particular, a system value is determined which represents the available memory space requirement for reconstructing an image and/or represents a reference value for a coil element of the magnetic resonance tomography facility MRE.

In act S4, a prepare function is executed, which checks whether, as regards the captured system values, the imported parameters are implementable in the MRT examination. If the parameters are implementable, then they are displayed at the input/output unit, for instance.

If the parameters are not implementable, then in act S5, a modifying function is calculated which modifies the imported parameters on the basis of the current system values and the required system resources.

In act S6, the imported parameters are modified, and the prepare function is repeated using these modified parameters, until a valid parameter dataset is determined. In particular in this process, the number of coil channels is reduced in steps down to a pre-configured limit.

The method is explained in greater detail below using the example of the memory system-resource.

There may be no prior knowledge of the relationship between amount of memory and number of coil channels. It is not easily possible to predict fully whether the available memory space is sufficient for certain calculations. Existing solutions from the prior art are highly time-consuming because of the large number of calculations and may also need a large amount of memory space. For instance, a calculation of a proposed specific absorption rate (SAR) needs about 30-40 sequence preparations.

According to the present disclosure, the computing time is shortened by using a linear search approach, as illustrated in the following exemplary embodiment. In this process, the number of coil channels is progressively reduced until a valid solution has been found.

The relationship between the number of coil channels and system resource SR may be expressed as a function. This may be linear or quadratic. In the present case, the function $f$ calculates the required amount of memory as a function of the channel count, where R denotes the number of coil channels:

linear: f(R)=a*R+b, in particular where "b=0"

direct: f(R)=a*R quadratic: f(R)=a*R*R+b*R+c

The problem of whether a sequence having specific parameters may be implemented by a limited memory volume of a magnetic resonance tomography facility MRTE may be the starting point. A multistage calculation is required to solve the problem.

First, a sequence having associated parameters and system resources is selected. Corresponding parameter values and values of the system resources, in this case the available memory volume, are imported.

Step 1.)

In a first calculation, the required amount of memory B is determined as a function of a first channel count R1.

If the amount of memory available is less than the amount of memory required, the available memory is used to determine a first coil-channel reduction factor r. This yields:

$$r=V/B(R1);\ \text{from which it follows that:}$$

$$R2=r*R1$$

R1 denotes a first value of the number of coil channels R, and R2 denotes a second value of the number of coil channels R.

Step 2.)

The coil-channel reduction factor r is determined from the ratio of the available memory space V to the required memory space B as a function of the first value R1 of the number of coil channels.

A second value R2 of the number of coil channels R is calculated from the product of the value R1 and the coil-channel reduction factor r.

The prepare function is now executed using the value R2, which represents a reduced number of coil channels r. The function B(R2) is thereby determined, which yields the required memory space on the basis of the reduced number R2 of coil channels.

Two different situations exist here.

In a first situation, the available memory space is sufficient for the number of reduced coil channels, because the relationship was direct.

In this case, a check is performed as to whether an increase in the number of coil channels is possible. If the increase is not possible, the reduced number of coil channels R2 is used to work with. If the increase is possible, the number of coil channels is increased to a value R2+. The prepare function is used again to determine whether the available memory space V is less than the required memory space B. The method continues until a limit value is reached.

In a second situation, if the available memory space V is still not sufficient, a linear equation system is solved for a and b:

$$B(R1)=a*R1+b$$

$$B(R2)=a*R2+b$$

On the basis thereof, the number of coil channels R3 is determined that would be valid in the case of a linear dependency.

$$R3=(V-b)/a$$

Step 3.)

The prepare function is now executed using the number of coil channels R3. If the prepare function determines a sufficient memory space on the basis of the number of coil channels R3, then the steps given in the first situation of Step 2.) are resumed using the value R3.

If the available memory space V is still not sufficient, a quadratic equation system is solved:

$$B(R1,2,3)=a*R1,2,32+b*R1,2,3+c$$

On the basis thereof, the number of coil channels R4 are determined that would be valid in the case of a quadratic dependency.

Step 4.)

The prepare function is now executed using the number of coil channels R4.

If the prepare function determines a sufficient memory space on the basis of the number of coil channels R4, then the steps given in the first situation of Step 2.) are resumed using the value R4.

If it is determined that there is not sufficient memory space, then the number of coil channels is reduced to R4—until the prepare function delivers a result for which, using a final number of coil channels, the available memory space is feasible for a sequence using its parameters.

The valid parameter dataset is displayed at an input/output unit EA. It may also be stored in a Cloud system or on various storage devices or systems.

The method described herein may be implemented as a computer program product.

The parameter dataset determined thereby is thus within the limits of the system resources (e.g., memory space) and is the valid parameter dataset, which may be used for an MRT examination.

The described method significantly reduces the time for calculating a valid parameter dataset for a sequence and hence for a plurality of sequences of a protocol. The operator receives the valid values more quickly, and the patient has to wait less. The latter is relevant in the sense that the patient is not meant to move during the examination and is meant to breath-hold for certain examinations.

In addition, parameters are determined that are valid within defined limit values. The risk is reduced that patients might be harmed by incorrectly set parameters (e.g., burns caused by an excessive RF load).

Advantageously, MRT examinations may be performed using a large number of coil channels even when there is less memory space.

The method may be used analogously for many different kinds of searches for solutions in the field of MRT examinations, such as: SAR solving in order to satisfy limit values of the applied RF power for restricting heating of the patient's body; stimulation solver in order to satisfy limit values of the gradient switching activity in order to avoid stimulating the muscles of the patient; or orientation test in order to satisfy the available gradient power in relation to the gradient axes so as to prevent damage to the MR hardware.

In conclusion, the disclosure and the exemplary embodiments, shall not be considered restrictive as regards a specific physical realization of the disclosure. All the features illustrated and explained in association with the individual embodiments of the disclosure may be provided in various combinations in the subject matter according to the disclosure to achieve the advantageous effects of these embodiments simultaneously.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present disclosure has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A computer-implemented method for determining a valid parameter dataset for a protocol in advance of a magnetic resonance tomography (MRT) examination by a magnetic resonance tomography facility, the method comprising:

importing, at an input facility of the magnetic resonance tomography facility, parameters intended to be used for performing the MRT examination, wherein the parameters comprise a reference value for a number of required coil channels;

calculating system resources required to perform the MRT examination using the parameters;

capturing current system values which represent an availability of a system resource for the MRT examination; and executing a prepare function, which checks, with regard to the captured current system values, whether the parameters are implementable in the MRT examination, and wherein, when the parameters are not implementable, the method further comprises:

calculating a modifying function for modifying the parameters based on the current system values and the required system resources, wherein a linear modifying function or a quadratic modifying function is determined dynamically based on a result of the prepare function;

modifying the parameters in accordance with the calculated modifying function; and executing repeatedly the prepare function in order to determine the valid parameter dataset.

2. The method of claim 1, wherein the availability of the system resource for the MRT examination indicates an available memory space requirement for reconstructing an image, a coil-channel count of the magnetic resonance tomography facility, or a combination thereof.

3. The method of claim 1, wherein the linear modifying function is a proportional modifying function.

4. The method of claim 1, wherein the modifying of the parameters comprises reducing the number of required coil channels in steps down to a pre-configurable limit.

5. The method of claim 1, further comprising:

determining a coil-channel reduction factor for applying in a reduction of the number of required coil channels.

6. The method of claim 1, wherein the calculating of the modifying function comprises solving a linear equation system or quadratic equation system that characterizes a linear relationship or quadratic relationship between a coil-channel number of the captured system values, a required memory space requirement, and an available memory space requirement.

7. The method of claim 1, wherein the captured current system values represent an available memory space requirement for image reconstruction.

8. The method of claim 7, wherein the available memory space requirement is a main-memory space requirement.

9. The method of claim 7, wherein the number of required coil channels is reduced by a coil reduction factor, which is recalculated for each step of a stepwise modification.

10. The method of claim 7, wherein the number of required coil channels is reduced by a coil reduction factor, which is determined based on the required memory space requirement, the available memory space requirement, and the required number of coil channels.

11. The method of claim 7, wherein the number of required coil channels are reduced by a first coil reduction factor, wherein, following the reduction by the first coil reduction factor, the prepare function is executed in order to determine a second memory space requirement, wherein, when the second memory space requirement is sufficient, a check is performed as to whether an increase in the number of required coil channels is possible, and wherein, when the second memory space requirement is not sufficient, a linear equation system is solved in order to determine the number of required coil channels.

12. The method of claim 11, wherein the number of required coil channels are further reduced by a second coil reduction factor in a second step, wherein, following the reduction by the second coil reduction factor, the prepare function is executed in order to determine a third memory space requirement, wherein, when the third memory space requirement is sufficient, a check is performed as to whether an increase in the number of required coil channels is possible, and wherein, when the third memory space requirement is not sufficient, a quadratic equation system is solved in order to determine the number of required coil channels.

13. The method of claim 1, wherein a captured current system value of the captured current system values represents a reference value for monitoring an applied radio frequency power.

14. The method of claim 1, wherein a captured current system value of the captured current system values represents a reference value for monitoring an applied gradient switching activity in order to avoid stimulating muscles of a patient.

15. The method of claim 1, wherein a captured current system value of the captured current system values represents a reference value for monitoring an applied gradient power in relation to gradient axes and/or a gradient switching activity in order to prevent damage to components of the magnetic resonance tomography facility.

16. An apparatus for determining a valid parameter dataset for a protocol for a magnetic resonance tomography (MRT) examination by a magnetic resonance tomography facility, the apparatus comprising:

an input facility configured to import, at the magnetic resonance tomography facility, at least one parameter configured to be used for performing the MRT examination, the at least one parameter comprising a reference value for a number of required coil channels;

an interface configured to capture at least one current system value representing an availability of a system resource for the MRT examination;

a processor configured to calculate system resources required to perform the MRT examination using the at least one parameter, wherein the processor is further configured to execute a prepare function that checks whether, with regard to the captured current system values, the at least one parameter is implementable in the MRT examination, and wherein, when the at least one parameter is not implementable, the processor is further configured to:

calculate a modifying function for modifying the parameters based on the current system values and the required system resources, wherein a linear modifying function or a quadratic modifying function is determined dynamically based on a result of the prepare function;

modify the parameters in steps in accordance with the calculated modifying function; and execute repeatedly the prepare function in order to determine the valid parameter dataset.

17. The apparatus of claim 16, wherein the availability of the system resource for the MRT examination indicates an available memory space requirement for reconstructing an image, a coil-channel count of the magnetic resonance tomography facility, or a combination thereof.

18. The apparatus of claim 16, wherein the linear modifying function is a proportional modifying function.

19. The apparatus of claim 16, wherein the modification of the parameters comprises a reduction of the number of required coil channels in steps down to a pre-configurable limit.

20. A magnetic resonance tomography facility comprising:

an apparatus configured to determine a valid parameter dataset for a protocol for a magnetic resonance tomography (MRT) examination by the magnetic resonance tomography facility, wherein the apparatus comprises:

an input facility configured to import, at the magnetic resonance tomography facility, at least one parameter configured to be used for performing the MRT examination, the at least one parameter comprising a reference value for a number of required coil channels;

an interface configured to capture at least one current system value representing an availability of a system resource for the MRT examination;

a processor configured to calculate system resources required to perform the MRT examination using the at least one parameter, wherein the processor is further configured to execute a prepare function that checks whether, with regard to the captured current system values, the at least one parameter is implementable in the MRT examination, and wherein, when the at least one parameter is not implementable, the processor is configured to:

calculate a modifying function for modifying the parameters based on the current system values and the required system resources, wherein a linear modifying function or a quadratic modifying function is determined dynamically based on a result of the prepare function;

modify the parameters in steps in accordance with the calculated modifying function; and execute repeatedly the prepare function in order to determine the valid parameter dataset.

21. The magnetic resonance tomography facility of claim 20, wherein the availability of the system resource for the MRT examination indicates an available memory space requirement for reconstructing an image, a coil-channel count of the magnetic resonance tomography facility, or a combination thereof.

22. The magnetic resonance tomography facility of claim 20, wherein the linear modifying function is a proportional modifying function.

23. The magnetic resonance tomography facility of claim 20, wherein the modification of the parameters comprises a reduction of the number of required coil channels in steps down to a pre-configurable limit.

* * * * *